United States Patent
Jones et al.

(10) Patent No.: US 11,841,732 B2
(45) Date of Patent: Dec. 12, 2023

(54) PREDICTIVE CLOCK CONTROL

(71) Applicant: Graphcore Limited, Bristol (GB)

(72) Inventors: Owain Jones, Bristol (GB); Daniel John Pelham Wilkinson, Bristol (GB)

(73) Assignee: GRAPHCORE LIMITED, Bristol (GB)

( * ) Notice: Subject to any disclaimer, the term of this patent is extended or adjusted under 35 U.S.C. 154(b) by 322 days.

(21) Appl. No.: 17/363,564

(22) Filed: Jun. 30, 2021

(65) Prior Publication Data
US 2022/0050494 A1    Feb. 17, 2022

(30) Foreign Application Priority Data

Aug. 11, 2020 (GB) ...................... 2012453

(51) Int. Cl.
| | | |
|---|---|---|
| *G11C 16/00* | (2006.01) | |
| *G06F 9/50* | (2006.01) | |
| *G06F 1/08* | (2006.01) | |
| *H03K 5/00* | (2006.01) | |
| *G06F 9/48* | (2006.01) | |
| *G06F 9/52* | (2006.01) | |

(52) U.S. Cl.
CPC .............. *G06F 9/5094* (2013.01); *G06F 1/08* (2013.01); *G06F 9/4893* (2013.01); *G06F 9/522* (2013.01); *H03K 5/00006* (2013.01)

(58) Field of Classification Search
CPC ........ G06F 9/5094; G06F 1/08; G06F 9/4893; G06F 9/522
See application file for complete search history.

(56) References Cited

U.S. PATENT DOCUMENTS

| | | | |
|---|---|---|---|
| 2010/0153761 A1 | 6/2010 | Nishioka | |
| 2014/0146931 A1* | 5/2014 | Sagi | G06F 1/12 |
| | | | 375/362 |
| 2017/0115686 A1* | 4/2017 | Tran | G06F 1/12 |
| 2019/0121784 A1 | 4/2019 | Wilkinson | |
| 2019/0213275 A1* | 7/2019 | Shankar | G06F 16/252 |
| 2019/0272002 A1 | 9/2019 | Seenappa | |

OTHER PUBLICATIONS

Search Report dated May 10, 2021 for United Kingdom Patent Application No. GB2012453.3. 4 pages.

* cited by examiner

*Primary Examiner* — Pho M Luu

(74) *Attorney, Agent, or Firm* — HAYNES AND BOONE LLP

(57) ABSTRACT

A predictive clock controller is provided for modifying the frequency of a clock signal provided to a processing unit based on knowledge of the power usage by the application running on the processing unit during different execution periods. The predictive clock controller counts barrier syncs for the application, so as to determine where the application is in its sync schedule. The predictive clock controller is able to determine from the number of counted syncs, when the application will transition from one execution period to another execution period with different power requirements, and to adjust the clock frequency accordingly.

21 Claims, 11 Drawing Sheets

| Execution Period | Number of barrier syncs | Indication of power | Clock Frequency |
|---|---|---|---|
| 1 | 10 | Medium | 800 MHz |
| 2 | 6 | Low | 1.6 GHz |
| 3 | 12 | High | 400 MHz |
| 4 | 20 | Medium | 800 MHz |
| 5 | 5 | Low | 1.6 GHz |
| 6 | 3 | High | 400 MHz |
| 7 | 9 | Medium | 800 MHz |

Fig. 7A

| Execution Period | Number of barrier syncs | Number of credits at start of execution period | Number of credits remaining at end of execution period | Indication of power |
|---|---|---|---|---|
| 1 | 10 | 16 | 6 | Medium |
| 2 | 6 | 6 | 0 | Low |
| 3 | 12 | 32 | 20 | High |
| 4 | 20 | 20 | 0 | Medium |
| 5 | 5 | 17 | 12 | Low |
| 6 | 3 | 12 | 9 | High |
| 7 | 9 | 9 | 0 | Medium |

| Execution Period | Number of barrier syncs | Number of credits at start of execution period | Number of credits remaining at end of execution period | Indication of power |
|---|---|---|---|---|
| 1 | 10 | 10 | 0 | Medium |
| 2 | 6 | 6 | 0 | Low |
| 3 | 12 | 12 | 0 | High |
| 4 | 20 | 20 | 0 | Medium |
| 5 | 5 | 5 | 0 | Low |
| 6 | 3 | 3 | 0 | High |
| 7 | 9 | 9 | 0 | Medium |

PREDICTIVE CLOCK CONTROL

CROSS-REFERENCE TO RELATED APPLICATIONS

The present application claims priority to United Kingdom Patent Application No. 2012453.3, filed on Aug. 11, 2020, the disclosure of which is hereby incorporated herein by reference in its entirety.

TECHNICAL FIELD

The present disclosure relates to clock control for a processing unit. In particular, the present disclosure relates to controlling the frequency of a clock signal for the processing unit in response to barrier synchronisations of a predetermined type.

BACKGROUND

When executing an application on a processing unit there are many different variables which affect the performance of the processing unit when executing that application. These variables include the voltage at which the processing unit is running, the current drawn by the processing unit, the temperature of the processing unit, and the clock frequency, which is controlled by a processing unit clock signal. There are many contexts in which these factors become interdependent. This makes selecting an optimum frequency for a processing unit clock signal very challenging.

There are two potentially opposing considerations when selecting a processing unit clock frequency. On the one hand, there is a general desire not to "waste power". The faster a clock runs, the more power will be consumed by the application running on the processing unit. On the other hand, processing units are increasingly being built with a capacity to run "hot", that is, with high-power budgets. The faster the processing unit clock runs, the more efficiently a particular application can be executed and deliver its output. This is particularly the case for processing units which act as accelerators for processing the demanding workloads in artificial intelligence/machine learning applications.

One factor that increases the challenge when attempting to select an optimum clock frequency is that any given application running on a processing unit may vary in its power requirements over its execution. For instance, when entering computationally intensive phases of an application, there is an increase in the number of switching elements in the processing unit that are switched every clock cycle. Such an increase in the amount of switching in the processing unit leads to an increase in the amount of power that must be drawn by the processing unit to prevent failures in the processing unit's operations.

As the processing unit's power requirements vary over execution of an application, during some periods there is a danger that the power drawn by the processing unit may exceed a power budget for the processing unit. In these circumstances, it is desirable to lower the clock frequency as to prevent the power budget from being exceeded. On the other hand, when the processing unit executes less computationally intensive code with lower power usage, the clock frequency can be increased so as to enable the application to execute more rapidly.

SUMMARY

One challenge is determining when and how to modify the clock frequency during execution of the application. Typical approaches to this problem are reactive. In other words, they attempt to measure a quantity, e.g. impedance, of the processor over time and then react to a change in the measured quantity by modifying the clock frequency. One drawback with this approach is that there is a delay between the power requirements of the application running on the processor changing, and the reactive mechanism detecting the change and taking appropriate action. Therefore, there is a desire for an improved mechanism for determining when to modify the clock frequency.

According to a first aspect, there is provided a device for use with a processing unit running an application, the device comprising processing circuitry and at least one memory, wherein the at least one memory comprises: indications of power usage requirements during different execution periods of the application; an indication of a number of barrier synchronisations of a predetermined type for each of the different execution periods of the application, wherein the processing circuitry is configured to for each of the different execution periods of the application: determine whether or not a number of barrier synchronisations of the predetermined type performed during a current one of the execution periods has reached the indicated number of barrier synchronisations for that execution period stored in the memory, wherein each of the barrier synchronisations of the predetermined type is a barrier synchronisation following a compute phase of the processing unit; and in response to determining that the number of barrier synchronisations of the predetermined type performed during the current execution period has reached the indicated number for that execution period, modifying a frequency of a clock signal supplied to the processing unit by an amount dependent upon the indication of the power usage requirements for a next one of the execution periods following the current one of the execution periods.

Embodiments, therefore, provide a predictive technique for modifying the clock frequency. By storing an indication of the power requirements during different execution periods for the application, the device is able to modify the clock frequency as the application enters new execution periods. The device determines where the application is in its execution by monitoring the number of barrier synchronisations of a predetermined type. The device can then send a control signal causing the clock frequency to change depending upon where the application is in its execution. For example, if the application is about to enter an execution period in which it executes less computationally intensive code, the device may send a control signal to cause the clock frequency to increase so that the application executes faster. On the other hand, if the application is about to enter an execution period in which it executes more computationally intensive code, the device may send a control signal to cause the clock frequency to decrease so that the application does not consume too much power.

In some embodiments, at least one of the barrier synchronisations of the predetermined type is a barrier synchronisation for which data exchange occurs between the host system and the processing unit during a following exchange phase.

In some embodiments, at least one of the barrier synchronisations of the predetermined type is a null barrier synchronisation for which the processing unit does not exchange data in a following exchange phase.

In some embodiments, the barrier synchronisations of the predetermined type comprise all external barrier synchronisations participated in by the processing unit.

In some embodiments, the device is associated with at least one storage configured to store a number of credits that are decremented upon each of the barrier synchronisation of the predetermined type, wherein the step of determining that the number of barrier synchronisations of the predetermined type has reached the indicated number comprises determining that the number of credits has reached a predetermined number.

In some embodiments, for each of at least one of the different execution periods, the processing circuitry is configured to: at an end of the respective one of the at least one of the different execution periods, refreshing the number of credits.

In some embodiments, for each of the at least one of the different execution periods, the predetermined number is zero.

In some embodiments, for each of the at least one of the different execution periods: the step of modifying the frequency of the clock signal comprises sending a control signal to modify the clock frequency; and the processing circuitry is configured to: following the sending of the control signal to modify the clock frequency, receive an acknowledgment of the modification of the clock frequency; and in response to the acknowledgment, perform the step of refreshing the number of credits.

In some embodiments, each of the indications of the power usage requirements comprises at least one of: an indication of the application computations during the respective execution period; an explicit indication of power usage by the application during the respective execution period; or an indication of clock frequency to be used for the processing unit during the respective execution period.

In some embodiments, the at least one memory is configured to receive the indications of the number of barrier synchronisations of the predetermined type and the indications of power usage requirements during different execution periods of execution of the application from a compiler of the application.

In some embodiments, the processing unit comprises a plurality of processors.

According to a second aspect, there is provided a system comprising a device according to the first aspect, wherein the system comprises the processing unit.

In some embodiments, the system comprises sync logic associated with the at least one storage, wherein the sync logic is configured to for each barrier synchronisation of the predetermined type: receive a sync request; and in response to receipt of the sync request: acknowledge the sync request; and decrement the number of credits held in the at least one storage.

In some embodiments, the system comprises further sync logic configured to, for each of the barrier synchronisations of the predetermined type: receive a sync request from each of the processors of the processing unit; and in response to receipt of the sync requests from all of the processors of the processing unit, propagate the sync request to the sync logic associated with the at least one storage.

In some embodiments, the sync logic is configured to perform the step of acknowledging the sync request in response to determining that the number of credits is non-zero.

In some embodiments, the system is an integrated circuit.

According to a third aspect, there is provided a method for modifying a frequency of a clock signal supplied to a processing unit running an application, the method comprising for each of a set of different execution periods of the application: determining whether or not a number of barrier synchronisations of the predetermined type performed during a current one of the execution periods has reached an indicated number of barrier synchronisations for that execution period stored in memory, wherein each of the barrier synchronisations of the predetermined type is a barrier synchronisation following a compute phase of the processing unit; and in response to determining that the number of barrier synchronisations of the predetermined type performed during the current execution period has reached the indicated number for that execution period, modifying the frequency of the clock signal by an amount dependent upon a stored indication of the power usage requirements for a next execution period following the current execution period.

According to a fourth aspect, there is provided a computer program, which when executed by a processor causes a method for modifying a frequency of a clock signal supplied to a processing unit running an application to be carried out, the method comprising for each of a set of different execution periods of the application: determining whether or not a number of barrier synchronisations of a predetermined type performed during a current one of the execution periods has reached an indicated number of barrier synchronisations for that execution period stored in memory, wherein each of the barrier synchronisations of the predetermined type is a barrier synchronisation following a compute phase of the processing unit; and in response to determining that the number of barrier synchronisations of the predetermined type performed during the current execution period has reached the indicated number for that execution period, modifying the frequency of the clock signal by an amount dependent upon a stored indication of the power usage requirements for a next execution period following the current execution period.

According to a fifth aspect, there is provided a non-transitory computer readable medium storing the computer program according to the fourth aspect.

BRIEF DESCRIPTION OF DRAWINGS

For a better understanding of the present invention and to show how the same may be carried into effect, reference will now be made by way of example to the accompanying Figures in which:

FIG. 7A illustrates an example of information providing an indication of power requirements during different execution periods of an application and the number of external syncs during each period;

FIG. 7B illustrates an example of information providing an indication of power requirements for different execution periods and credit information for each execution period;

FIG. 7C illustrates a further example of information providing an indication of power requirements for different execution periods and credit information for each execution period;

DETAILED DESCRIPTION

This application relates to a device—referred to as the predictive clock controller—that is configured to modify the clock frequency for a processing unit. The predictive clock controller is described in detail later in this description. An example of a processing unit which can operate with the predictive clock controller is first described.

Figure 1:
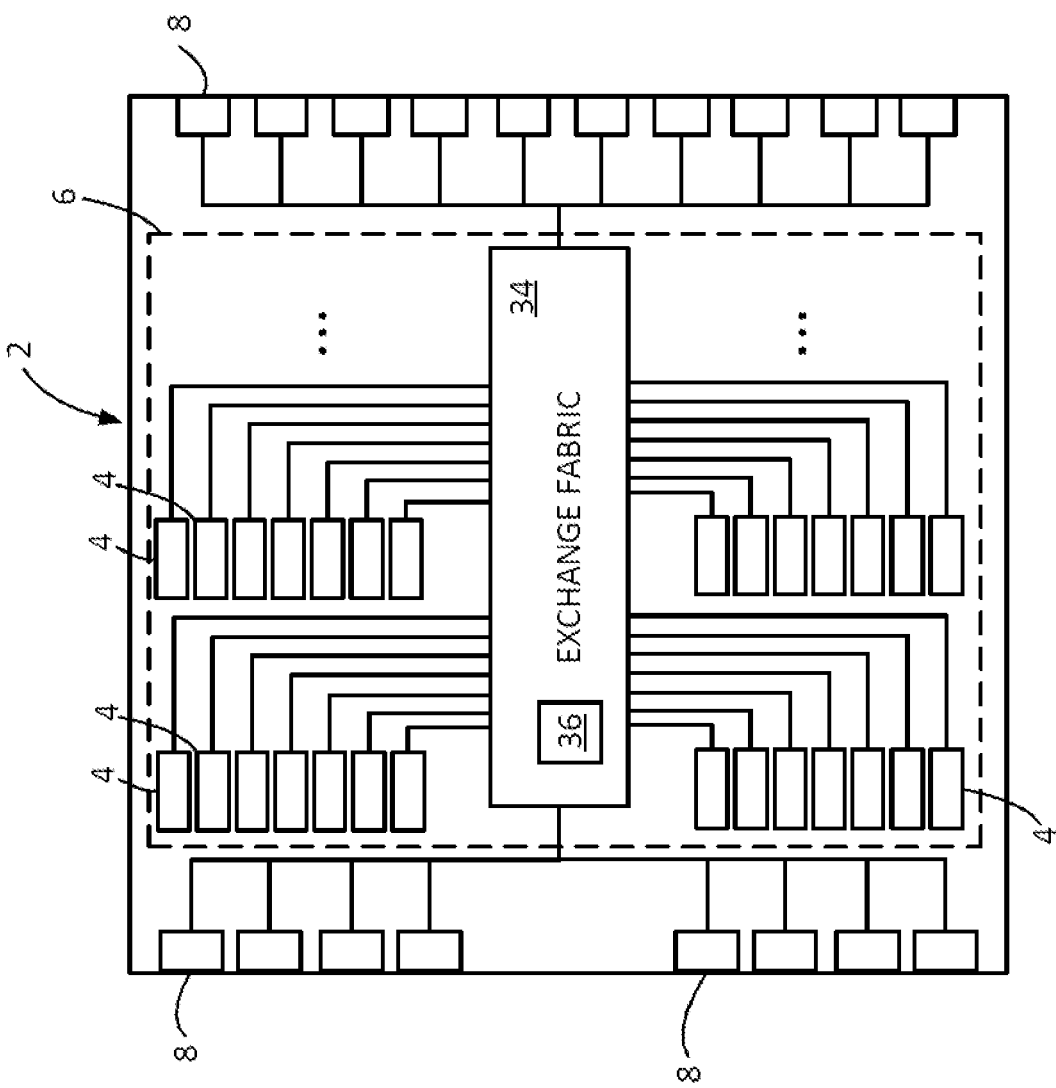
FIG. 1 is a schematic diagram of a multi-tile processor.

Reference is made to FIG. 1, which illustrates an example processing unit 2. This example processing unit 2 is a multi-tile processing unit 2. The processing unit 2 may be an Intelligence Processing Unit (IPU) that is described in our earlier U.S. application Ser. No. 15/886,065, the contents of which are incorporated by reference. Each of the IPUs is formed on a separate integrated circuit.

The processing unit 2 comprises an array 6 of multiple processor tiles 4 and an interconnect 34 connecting between the tiles 4. The processing unit 2 may be implemented alone as one of multiple dies packaged in the same IC package. The interconnect 34 may also be referred to herein as the "exchange fabric" 34 as it enables the tiles 4 to exchange data with one another. Each tile 4 comprises a respective instance of an execution unit and memory. For instance, by way of illustration, the processing unit 2 may comprise of the order of hundreds of tiles 4, or even over a thousand. For completeness, note also that an "array" as referred to herein does not necessarily imply any particular number of dimensions or physical layout of the tiles 4.

In embodiments, each processing unit 2 also comprises one or more external links 8, enabling the processing unit 2 to be connected to one or more other processing units (e.g. one or more other instances of the same processing unit 2). These external links 8 may comprise any one or more of: one or more processing unit-to-host links for connecting the processing unit 2 to a host system, and/or one or more processing unit-to-processing unit links for connecting together with one or more other instances of the processing unit 2 on the same IC package or card, or on different cards. The processing unit 2 receives work from the host, in the form of application data which it processes.

The interconnect 34 is configured to enable the different tiles 4 in the array 6 to communicate with one another. However, as well as there potentially being dependencies between threads on the same tile 4, there may also exist dependencies between the portions of the program running on different tiles 4 in the array 6. A technique is therefore required to prevent a piece of code on one tile 4 running ahead of data upon which it is dependent being made available by another piece of code on another tile 4. This is achieved using a data consistency model.

Parallel programming models for AI and Data Science usually follows a 3-phase iterative execution model: Compute, Barrier, and Exchange. The implications are that data transfer to and from a processor is usually barrier dependent to provide data-consistency between the processors and between each processor and an external storage. Typically used data consistency models are Bulk Synchronous Parallel (BSP), Stale Synchronous Parallel (SSP) and Asynchronous. The processing unit 2 described herein uses a BSP model, but it will be apparent that the other sync models could be utilised as an alternative.

Figure 2:
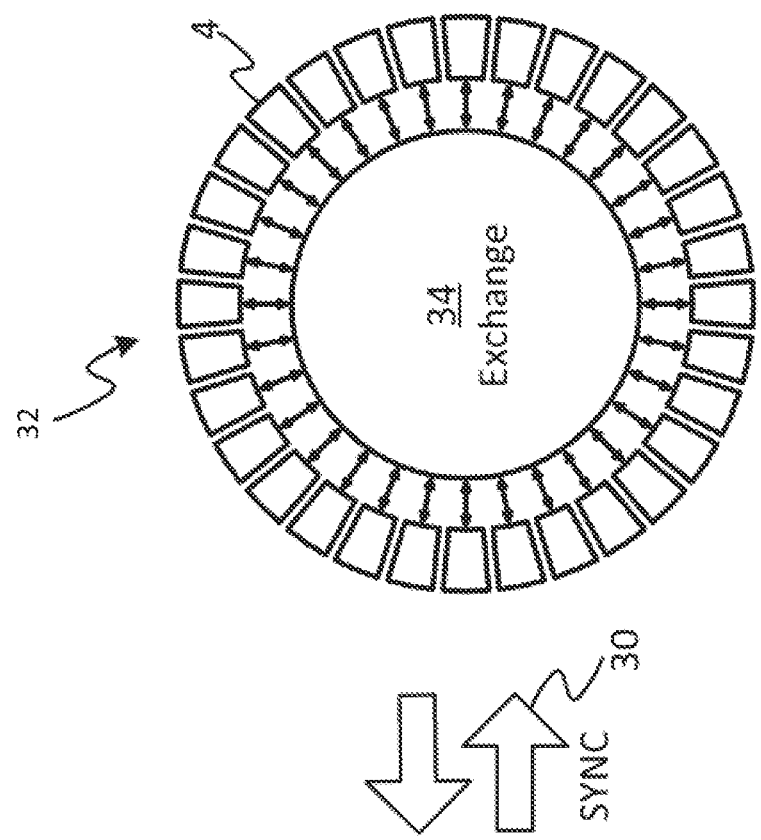
FIG. 2 is a schematic diagram illustrating the compute and exchange phases within a multi-tile processing unit.
Figure 2:
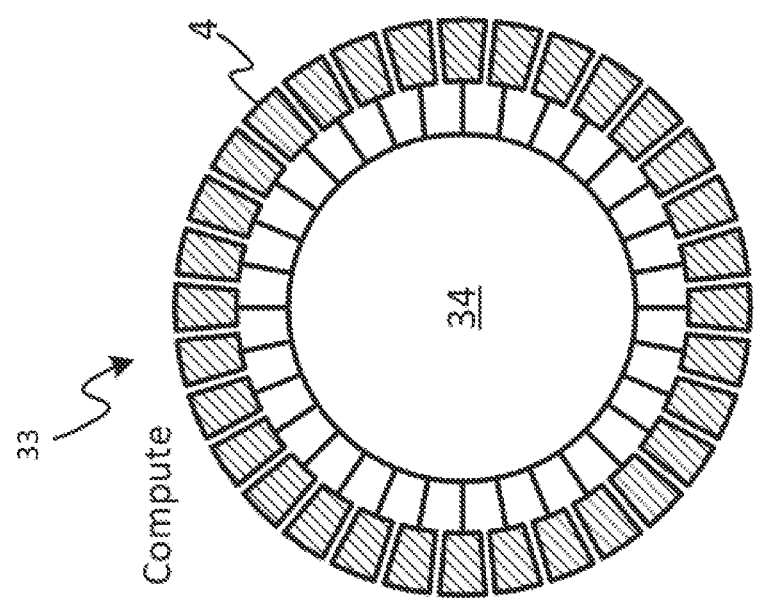
Figure 3:
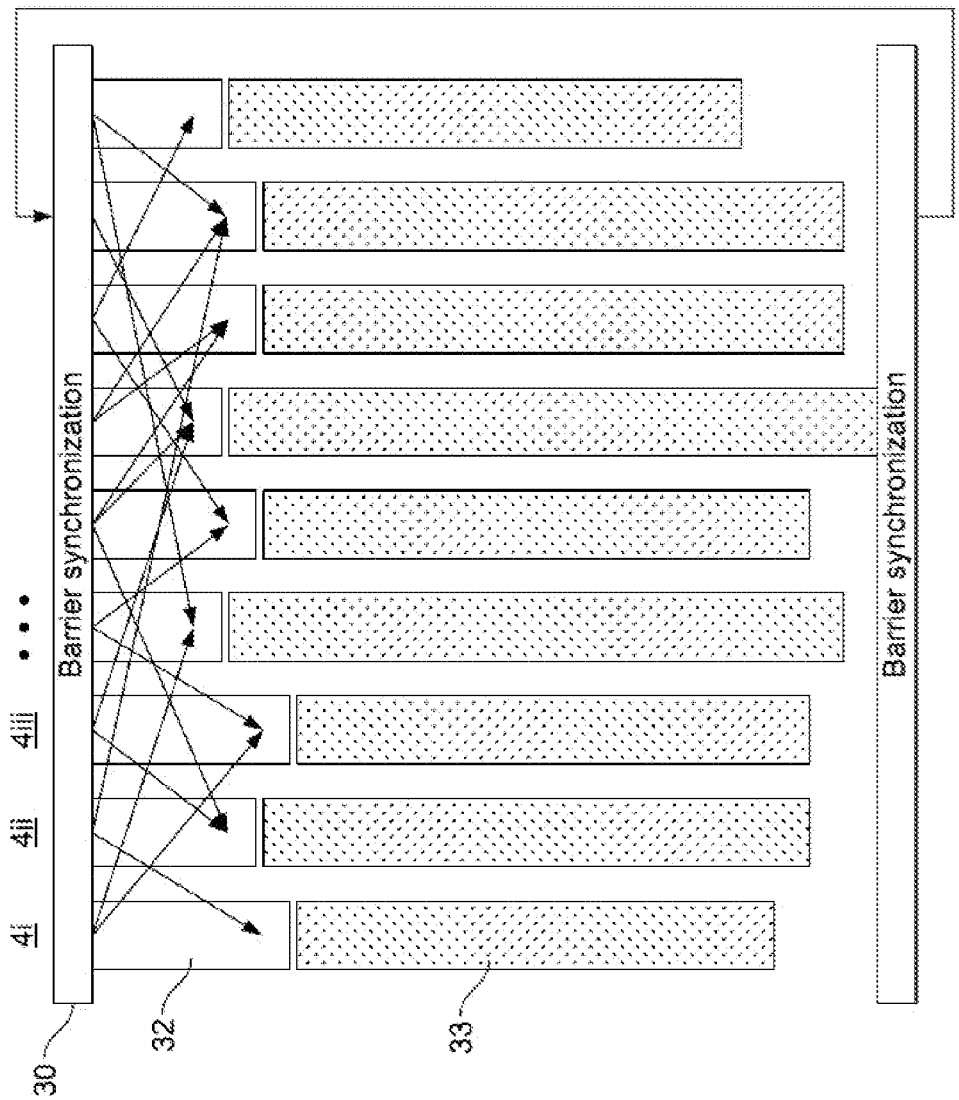
FIG. 3 illustrates exchange of data in a bulk synchronous parallel system.

Reference is made to FIGS. 2 and 3, which illustrate an implementation of a BSP exchange scheme in which each tile 4 performs a compute phase 33 and an exchange phase 32 in an alternating cycle, separated from one to the other by a barrier synchronization 30 between tiles. In the case illustrated by FIGS. 2 and 3, a barrier synchronization is placed between each compute phase 33 and the following exchange phase 32. During the compute phase 33, each tile 4 performs one or more computation tasks locally on-tile, but does not communicate any results of these computations with any others of the tiles 4. In the exchange phase 32, each tile 4 is allowed to exchange one or more results of the computations from the preceding compute phase to and/or from one or more others of the tiles 4, but does not perform any new computations until it has received from other tiles 4 any data on which its task(s) has/have dependency. Neither does it send to any other tile 4, any data except that computed in the preceding compute phase. It is not excluded that other operations such as internal control-related operations may be performed in the exchange phase 32. The communication external to the tile group may optionally utilise the BSP mechanism, but alternatively may not utilize BSP and may instead use some other synchronization mechanism of its own.

According to the BSP principle, a barrier synchronization 30 is placed at the juncture transitioning from the compute phase 33 into the exchange phase 32, or the juncture transitioning from the exchange phase 32 into the compute phase 33, or both. That is to say, either: (a) all tiles 4 are required to complete their respective compute phases 33 before any in the group is allowed to proceed to the next exchange phase 32, or (b) all tiles 4 in the group are required to complete their respective exchange phases 32 before any tile in the group is allowed to proceed to the next compute phase 33, or (c) both of these conditions are enforced. In all three variants, it is the individual tiles which alternate between phases, and the whole assembly which synchronizes. The sequence of exchange and compute phases may then repeat over multiple repetitions. In BSP terminology, each repetition of exchange phase and compute phase is sometimes referred to as a "superstep" (though note that in the literature the terminology is not always used consistently: sometimes each individual exchange phase and compute phase individually is called a superstep, whereas elsewhere, as in the terminology adopted herein, the exchange and compute phases together are referred to as a superstep).

Note also, it is not excluded that multiple different independent groups of tiles 4 on the same processing unit 2 or different processing units could each form a separate respective BSP group operating asynchronously with respect to one another, with the BSP cycle of compute, synchronize and exchange being imposed only within each given group, but each group doing so independently of the other groups. I.e. a multi-tile array 6 might include multiple internally synchronous groups each operating independently and asynchronously to the other such groups (discussed in more detail later). In some embodiments there is a hierarchical grouping of sync and exchange, as will be discussed in more detail later.

FIG. 3 illustrates the BSP principle as implemented amongst a group 4i, 4ii, 4iii of some or all of the tiles in the array 6, in the case which imposes: (a) a barrier synchronization from compute phase 33 to exchange phase 32 (see above). Note that, in this arrangement, some tiles 4 are allowed to begin computing 33 whilst some others are still exchanging.

The BSP model is used for exchange of data between tiles 4 on the processing unit 2. The communication between tiles 4 of a processing unit 2 occurs in time deterministic fashion in which data packets are transmitted without headers as in our earlier application U.S. patent application Ser. No. 15/886,315. Additionally, the BSP model may also be used for the exchange of data between processing units 2.

Figure 4:
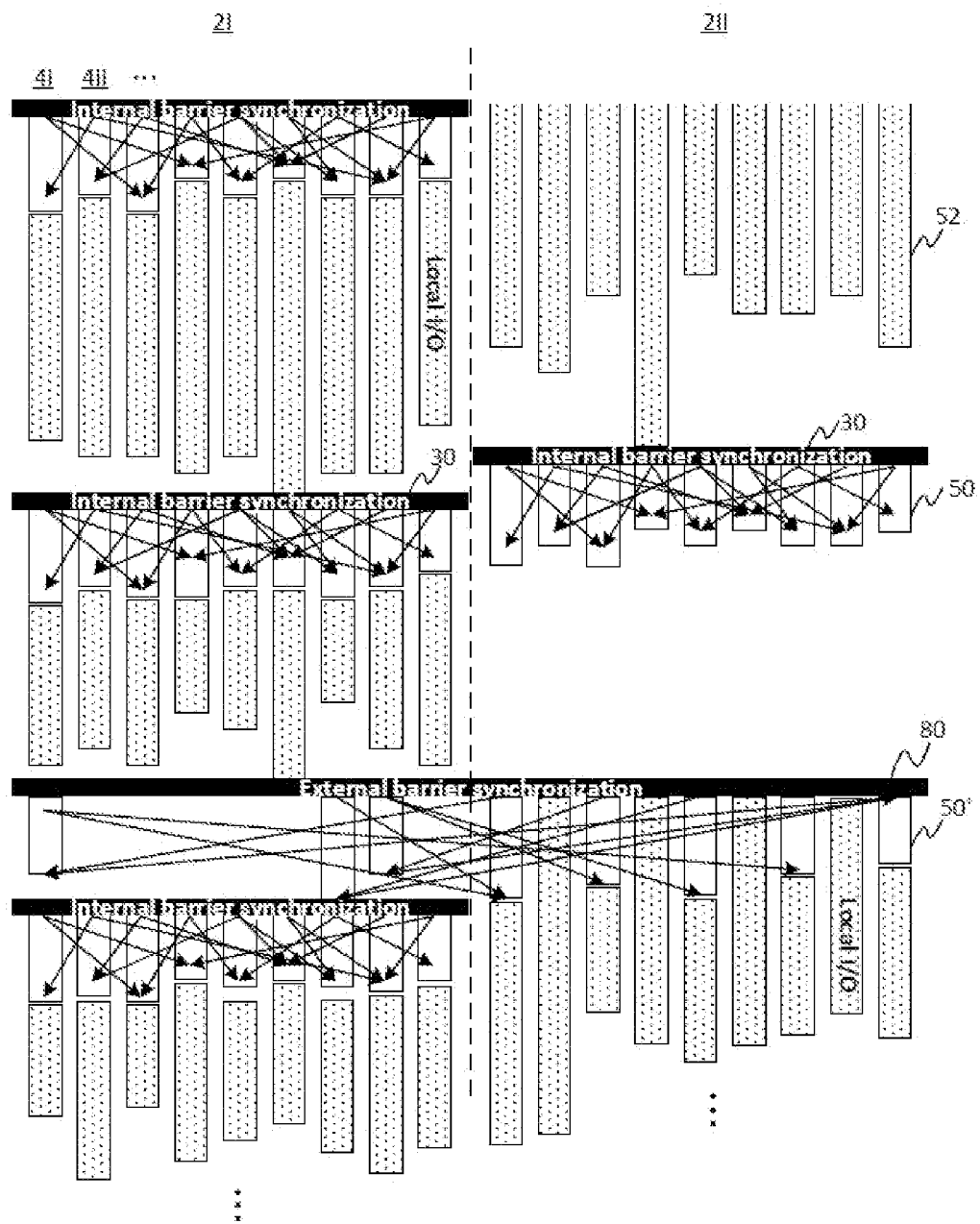
FIG. 4 is a schematic illustration of internal and external synchronisation barriers.

Reference is made to FIG. 4 illustrates an example BSP program flow involving both internal (on-chip) and external (inter-chip) synchronizations. As shown, the flow comprises internal exchanges 50 (of data between tiles 4 on the same chip 2) and an external exchange 50' (of data between tiles 4 on different chips 2). The program flow in FIG. 4 illustrates a program flow for a first processing unit 2i and a second processing unit 2ii.

As illustrated in FIG. 4, the internal BSP supersteps (comprising the internal exchanges 50 of data between tiles 4 on the same chip 2) are kept separate from the external sync and exchange (comprising the external exchanges 50' of data between tiles 4 on different chips 2).

The program may be arranged to perform a sequence of synchronizations, exchange phases and compute phases comprising, in the following order: (i) a first compute phase, then (ii) an internal barrier synchronization 30, then (iii) an internal exchange phase 50, then (iv) an external barrier synchronization 80, then (v) an external exchange phase 50'. The external barrier 80 is imposed after the internal exchange phase 50, such that the program only proceeds to the external exchange 50' after the internal exchange 50. Note also that, as shown with respect to chip 2I in FIG. 4, optionally a compute phase may be included between internal exchange (iii) and external barrier (iv).

This overall sequence is enforced by the program (e.g. being generated as such by the compiler). In embodiments, the program is programmed to act in this way by means of a SYNC instruction executed by the tiles 4. The internal synchronization and exchange does not extend to any tiles or other entities on another chip 2. The sequence (i)-(v) (with the aforementioned optional compute phase between iii and iv) may be repeated in a series of overall iterations. Per iteration there may be multiple instances of the internal compute, sync and exchange (i)-(iii) prior to the external sync & exchange. I.e. multiple instances of (i)-(iii) (retaining that order), i.e. multiple internal BSP supersteps, may be implemented before (iv)-(v), i.e. the external sync and exchange. Note also, any of the tiles 4 may each be performing their own instance of the internal synchronization and exchange (ii)-(iii) in parallel with the other tiles 4.

Thus per overall BSP cycle (i)-(v) there is at least one part of the cycle (ii)-(iii) wherein synchronization is constrained to being performed only internally, i.e. only on-chip.

Note that during an external exchange 50 the communications are not limited to being only external: some tiles may just perform internal exchanges, some may only perform external exchanges, and some may perform a mix.

Also, as shown in FIG. 4, some tiles 4 may perform local input/output during a compute phase. For example, they may exchange data with a host or other type of external storage.

Note also that, as shown in FIG. 4, it is in general possible for any or all tiles to have a null compute phase 52 or a null exchange phase 50 in any given BSP superstep.

Each of the synchronisation barriers shown in FIG. 4 is passed by the tiles 4 once an exchange of transmission of sync requests and acknowledgments has completed. For an internal barrier synchronisation, each tile 4 in a processing unit 2, once it reaches an internal barrier synchronisation, sends an internal sync request to the internal synchronisation controller 36 in the interconnect 34. When the internal synchronisation controller 36 has received sync requests from all of the tiles 4 that are part of the processing unit 2, the sync controller 36 returns sync acknowledgments to each of the tiles 4. Upon receiving the sync acknowledgments, each of the tiles 4 then enters the exchange phase in which data exchange between the tiles 4 occurs. This technique ensures the each tile 4 must reach the barrier before any of the tiles can progress to the exchange phase.

For an external barrier synchronisation, the exchange of sync requests and acknowledgments takes place between a group of processing units 2, referred to as a synchronisation group. Following the exchange of sync requests and acknowledgments, the processing units 2 exchange data during an exchange phase.

Each of the tiles 4 on the processing unit 2, once it reaches the external synchronisation barrier, issues an external sync request to external sync logic (not shown in FIG. 1) that is associated with the processing unit 2. Once the external sync logic has received a sync request from all of the tiles 4 on the processing unit 2, it either acknowledges those sync requests or propagates a sync request to a further entity that is part of the sync group. The further entity could be a proxy for exchanging data with a host system or external sync logic associated with another processing unit 2.

When a sync request is propagated to another processing unit 2, the action taken by the external sync logic in that other processing unit 2 in response to the sync request depends upon whether the logic is defined as the master for the sync group or as a propagation node for that group. The propagation nodes propagate their received sync requests towards the master defined for the sync group. The sync master, once it has received external sync requests for each of the processing units 2 that are part of the sync group, returns sync acknowledgments to the external sync logic associated with each of the other processing units 2 in the sync group. The sync master also returns sync acknowledgments to each of the tiles 4 in its own processing unit 2. Each external sync logic (i.e. the propagation nodes) of the other processing unit 2 in the sync group, upon receiving a sync acknowledgment, returns sync acknowledgments to the tiles 4 of its processing unit 2. In response to receiving the sync acknowledgements, the tiles 4 pass the barrier synchronisation and exchange data with the other processing units 2 of the sync group during the exchange phase. This exchange of data between different processing units 2 is done in a non-time deterministic manner as described in our earlier application U.S. application Ser. No. 15/886,065.

In addition to an external barrier synchronisation that provides for exchange of data between processing units 2, a different type of external barrier synchronisation may be performed following which data is exchanged between the processing unit 2 and a host system 520. Such data may comprise application data provided by the host system 520 for processing by the processing unit 2. The data may comprise results of processing by the processing unit 2 that are provided to the host system 520. This type of barrier synchronisation is referred to as a barrier synchronisation with host involvement. This barrier synchronisation is implemented by the external sync logic propagating sync requests to one or more proxies for communicating with the host 520. The proxies acts as sync masters and return sync acknowledgments to the sync logic. This process is discussed in more detail later in the description.

Therefore, according to embodiments of the application, different types of barrier synchronisations may be implemented in a system.

Embodiments of the present invention are implemented by counting the number of barrier synchronisations of a predetermined type. In some embodiments, the barrier synchronisations of the predetermined type may comprise all of the barrier synchronisations. In other embodiments, the barrier synchronisations of the predetermined type may comprise only a subset of the barrier synchronisations.

The barrier synchronisations of the predetermined type may comprise barrier synchronisations with host involvement. Following each such barrier synchronisation, data is exchanged between the processing unit 2 and the host system during an exchange phase for the processing unit 2. The barrier synchronisations of the predetermined type may, additionally or alternatively, comprise null barrier synchronisations, following which data exchange is not carried out to/from processing unit 2. The barrier synchronisations of the predetermined type may comprise a mixture of barrier synchronisations requiring host involvement and null barrier synchronisations. The synchronisations with host involvement and null synchronisations are discussed in more detail with respect to FIG. 5.

According to embodiments of the invention, a device—referred to as the predictive clock controller—is provided for monitoring the number of barrier synchronisations of the predetermined type and using this information to determine how to modify a clock frequency for the processing unit 2. The predictive clock controller may take the form of a module provided on the same integrated circuit as the processing unit 2, and is described in more detail with respect to FIG. 5.

Figure 5:
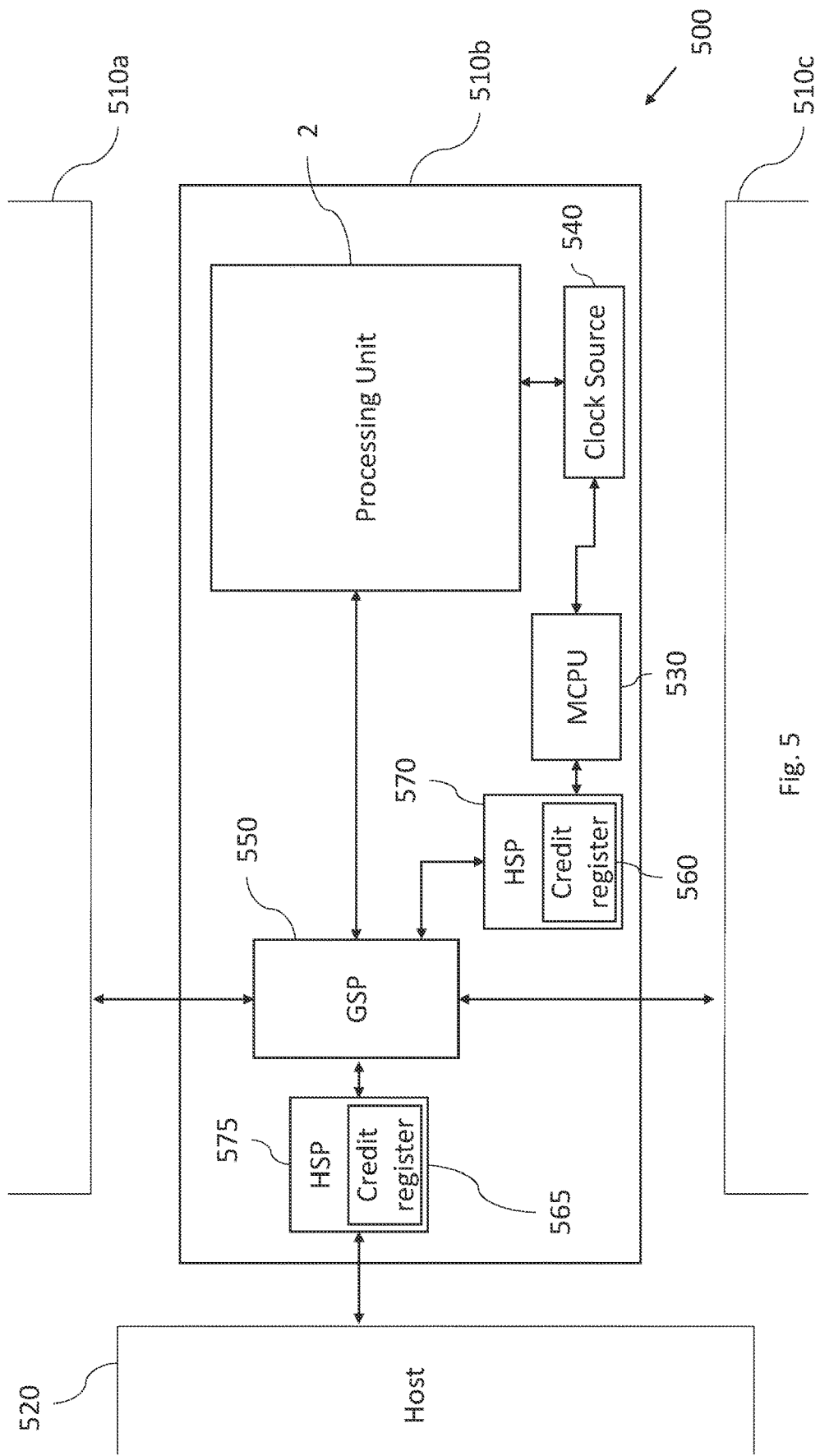
FIG. 5 is a schematic illustration of a system comprising a plurality of integrated circuits and a host system.

Reference is made to FIG. 5, which illustrates an example of a system 500. The system 500 comprises a plurality of integrated circuits (collectively referred to as chips 510) and at least one host device 520. Discussion here is made of operation of the chip 510*b*, but it would be appreciated that, in embodiments, the operation of the other chips 510 in the system may be the same.

The chip 510*b* comprises a processing unit 2. The processing unit 2 functions as an accelerator subsystem for the host 520. The processing unit 2 is associated with external sync logic 550. This external sync logic 550 is referred to herein as the global sync peripheral (GSP) 550. The GSP 550 receives external sync requests from the tiles 4 that are part of the processing unit 2. The GSP 550, after having received the external sync requests from the tiles 4 of the processing unit 2, passes the barrier synchronisation. As discussed above, the passing of the barrier synchronisation by the GSP 550 is performed either by propagating a sync request towards the master (e.g. another GSP 550) defined for the sync group or—if the GSP 550 is the sync master—returning sync acknowledgements to the tiles 4 of its associated processing unit 2 and to any off chip entities (e.g. other GSPs 550) from which it received sync requests. The GSP 550 has connections to the other chips 510*a*, 510*c* to enable the exchange of sync requests/acks with the GSPs of those chips 510*a*, 510*c* so as to enable the processing units on those chips 510*a*, 510*c* to synchronise with the processing unit 2 on chip 510*b*. The GSP 550 also has connections to the modules 570, 560, referred to as host sync proxies (HSPs) 570, 560. The HSPs 570, 560 are another type of sync logic that are used to control exchange of data with the host 520. The exchange of sync requests/acks with the HSPs 570, 560 allows the processing unit 2 to participate in a barrier synchronisation for exchanging data with the host 520.

The predictive clock controller 530 is shown labelled in FIG. 5 as a management CPU (MCPU) 530, and in some embodiments comprises a central processing unit (CPU), but is not limited as such.

Figure 6:
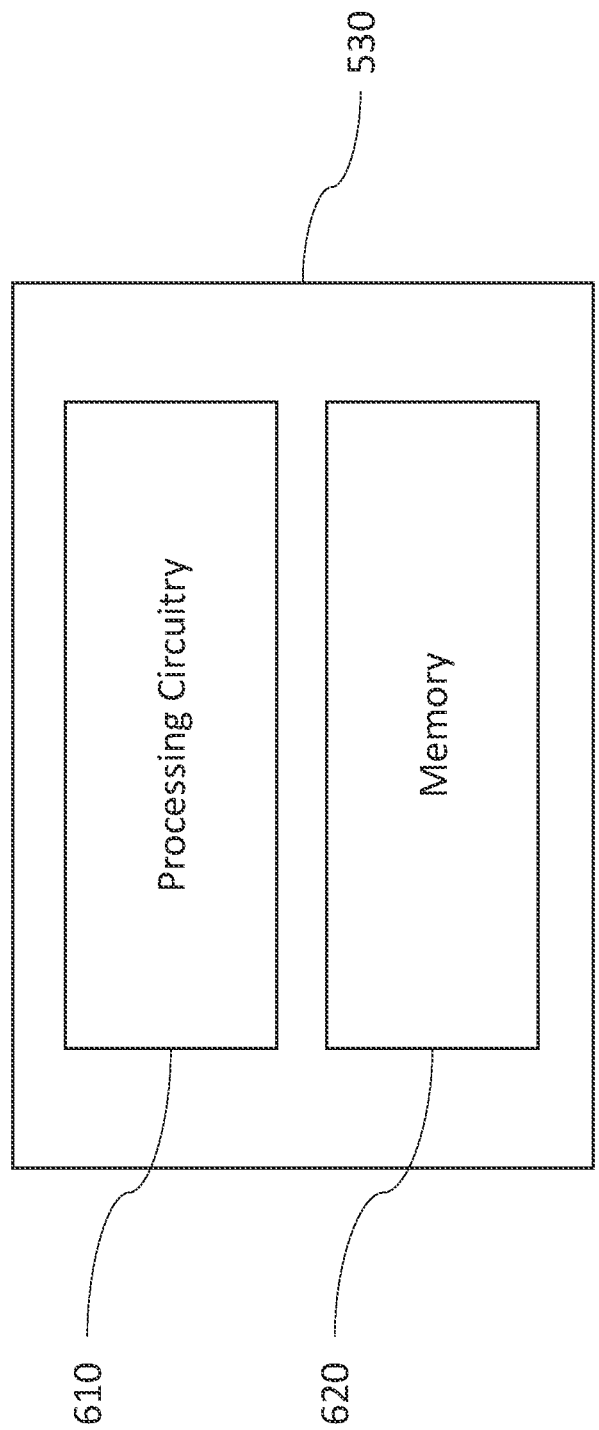
FIG. 6 is a schematic illustration of a predictive clock controller.

The predictive clock controller 530 is illustrated in more detail in FIG. 6. The predictive clock controller 530 includes processing circuitry 610 and memory 620. Although the predictive clock controller 530 is shown as an MCPU 530, it would be understood that the processing circuitry 610, in addition to or instead of comprising a processor configured to execute software instructions, could comprise a field programmable gate array (FPGA) or application specific integrated circuit (ASIC) for performing the functions described.

The predictive clock controller 530 is connected to a clock source 540 via a control bus. The clock source 540 may be a phase locked loop (PLL) 540. The clock source 540 provides a clock signal for clocking the processing unit 2. The predictive clock controller 530 can provide control signals to the clock source 540 to modify the frequency of the clock signal output by the clock source 540. Additionally or alternatively, the predictive clock controller 530 has connections to clock dividers (not shown) attached to the output of the clock source 540, in which case the predictive clock controller 530 sends control signals to the clock dividers to modify the frequency of the clock signal provided to the processing unit 2.

The operation of the processing unit 2 is divided into different execution periods. The execution periods are delineated by a change in the power requirements of the processing unit 2. A change in the power requirements implies that the optimum frequency of the clock signal supplied to the processing unit 2 has changed. Specifically, when the power requirements for an application running on the processing unit 2 are high (i.e. the application is in a computationally intensive phase), the clock frequency should be low, so as to prevent the power budget for the processing unit 2 from being exceeded. On the other hand, when the power requirements for an application running on the processing unit 2 are low (i.e. the application is not in a computationally intensive phase), the clock frequency should be high, so as to allow the application to execute faster.

The predictive clock controller 530 stores an indication of the number of barrier synchronisations of a predetermined type that are expected for each execution period of the application running on the processing unit 2. The predictive clock controller 530 determines when to adjust the clock frequency by counting the number of these barrier synchronisations. The predictive clock controller 530 determines to change the clock frequency when the number of barrier synchronisations of the predetermined type during the current execution period has reached the total number expected for the current execution period, thereby indicating the end of the current execution period.

Reference is made to FIG. 7A, which illustrates an example of the information that may be stored by the predictive clock controller 530 to allow it to determine when and how to modify the clock frequency in response to barrier synchronisations. As shown in the table 700, for each execution period, information about the number of barrier synchronisations of the predetermined type to be performed for the application running on the processing unit 2 is stored.

Additionally, for each execution period, an indication of the power requirements of the application running on the processing unit 2 are stored. The indication of power requirements gives an indication of the computational intensity of the application during the different execution periods.

The indication of the power requirements may take any form that allows the predictive clock controller 530 to adjust the clock frequency to take account of changing power requirements of the application. The indication of power requirements may comprise the clock frequency itself, an explicit indication of the power requirements, or information about the operations performed by the application during different execution periods from which estimates about power usage can be derived. The predictive clock controller 530 uses the information to determine the frequency of the clock signal to be provided to the processing unit 2.

In the example table 700, the indication of the power requirements comprises an indication as to whether or not the execution period is high power (i.e. the application is performing computationally intensive operations), medium power, or low power (i.e. the application is not performing computationally intensive operations). From this information, the predictive clock controller 530 assigns a clock frequency to be used for each execution period. Examples are shown in table 700 of the clock frequencies that may be assigned for each power level. If the predictive clock controller 530 determines that the application is moving into a higher power execution period, it sends a control signal to lower the clock frequency. If the predictive clock controller 530 determines that the application is moving into a lower power execution period, it sends a control signal to raise the clock frequency.

The process of counting the number of barrier synchronisations of a predetermined type may be implemented using a set of credits held in the credit register 560 of the HSP 570. The predictive clock controller 530 has access to the credit register 560. The function of the HSPs 570, 575 will now be explained in more detail.

When sync requests are issued by the tiles of the processing unit 2 to the GSP 550, the GSP 550 determines the action to take depending upon a sync mode indicated by the sync requests. The sync mode in a sync request indicates whether or not the corresponding barrier synchronisation is of the predetermined type. In embodiments, the barrier synchronisations of a predetermined type includes synchronisations for data exchange with the host. If the sync mode indicates that the requests are requests for a synchronisation involving data exchange with the host 520, the GSP 550 responds to the received sync requests by sending a sync request to the HSP 570, and a sync request to the HSP 575. Each of the HSPs 570, 575 acts as a sync master for a barrier synchronisation involving the host 520, and is configured to return a sync acknowledgment to the GSP 550 upon a credit condition being satisfied.

As shown, each of the HSPs 570, 575 comprises a credit register 560, 565, which stores a number of credits that controls whether or not a barrier synchronisation is passed by acknowledging a sync request received from the GSP 550. When a HSP 570, 575 receives a sync request from the GSP 550, it checks its credit register 560, 565. If the number of credits in its register 560, 565 is non-zero, the respective HSP 570, 575 acknowledges the sync request it received from the GSP 550. If the number of credits in its register 560, 565 is zero, the respective HSP 570, 575 does not acknowledge the sync request until the credits in its register 560, 565 are refreshed.

The GSP 550 waits for sync acknowledgements from both of the HSPs 570, 575. After having received sync acknowledgments from both HSPs 570, 575, the GSP 550 returns sync acknowledgments to the tiles of the processing unit 2. When the tiles of the processing unit 2 have received the sync acknowledgments, the barrier synchronisation is passed and the data exchange between the host 520 and the processing unit 2 occurs during the exchange phase for the processing unit 2.

The barrier synchronisations of the predetermined type may also include null barrier synchronisations in which no data is sent or received by the processing unit 2. In response to receiving sync requests from the tiles of the processing unit 2, where the sync mode setting of those sync requests indicates a null barrier synchronisation, the GSP 550 responds by propagating sync requests to both HSPs 570, 575. The action performed by the HSPs 570, 575 is the same as for the barrier synchronisation for host involvement. If the number of credits in registers 560, 565 is non-zero, the HSPs 570, 575, decrement the credits in registers 560, 565 and then return sync acknowledgments to the GSP 550, which returns sync acknowledgments to tiles of the processing unit 2. Since the barrier synchronisation is a null barrier synchronisation, no data exchange to/from the processing unit 2 occurs, and the processing unit 2 may proceed immediately to the next compute phase.

The host 520 is responsible for refreshing the credits in register 565 and the predictive clock controller 530 is responsible for refreshing the credits in register 560. At the start of each of at least some of the execution periods, the predictive clock controller 530 refreshes the number of credits in register 560 so that the number of credits is equal to the number of barrier synchronisations of the predetermined type that the application is to participate in during a following one or more execution periods.

As the application executes during the execution period, it causes sync requests to be issued to the GSP 550. The GSP 550 propagates those sync requests of the predetermined type to the HSP 570. Each time the HSP 570 receives such a sync request and acknowledges the sync request, it decrements the set of credits held in register 560.

The predictive clock controller 530 monitors the number of credits in register 560 and sends a signal to change the frequency of the clock signal provided to the processing unit 2 in dependence upon the number of credits in the register 560. Two different embodiments of this credit control mechanism are discussed below and described with respect to FIGS. 7B and 7C. FIGS. 7B and 7C represent more specific examples of the generalised information shown in FIG. 7A.

According to a first embodiment, the HSP 570 is configured to send an interrupt to the predictive clock controller 530 each time one of its credits is decremented. In response to receiving the interrupt, the predictive clock controller 530 determines the number of credits remaining in the register 560. The predictive clock controller 530 determines that the application has reached the end of its current execution period, and that the clock frequency should therefore be changed, in response to determining that the the number of credits in the register 560 has reached a predetermined number. The predetermined number may be zero or non-zero, and may be different for different execution periods.

Reference is made to FIG. 7B, which illustrates an example of the information that may be stored by the predictive clock controller 530 according to the first embodiment. In this example, the predictive clock controller 530 stores an indication of the number of credits at the start of each execution period, and the number of credits remaining at the end of each of execution period. Although the table 710 shows the number of barrier syncs of the predetermined type for each execution period, this information may be implicit in the credit information in the table 710 without a separate indication being stored by the predetermined clock controller 530. For simplicity, the clock frequency values are not shown in table 710, but these may be the same as the values shown in the table 700 in FIG. 7A.

The predictive clock controller 530 will adjust the frequency of the clock source 540 once the number of credits in the register 560 reaches a predetermined number assigned for the current execution period. The predictive clock controller 530 will also, at the end of some of the execution periods, refresh the number of credits once the clock frequency is updated. The refreshing of the number of credits takes place at least when that the number of credits reaches zero. The predictive clock controller 530 refreshes the credits so as to set the number of credits equal to the number of barrier syncs of the predetermined type for a following one or more execution periods.

For instance, in the example of FIG. 7B, the predetermined number of credits marking the end of the first execution period is six. Once the predictive clock controller 530 determines that the number of credits in the register is equal to six, the predictive clock controller 530 sends a control signal to adjust the frequency of the clock signal to the new value for the second execution period. Since the number of credits in register 560 at this time is non-zero, further barrier syncs of the predetermined type may take place before the update of the clock signal frequency is complete. In other words, the application may proceed to the second execution period before the updating of the clock signal to the new frequency for the second execution period is complete.

In the FIG. 7B example, the predetermined number of credits marking the end of the second execution period is zero. Once the predictive clock controller 530 determines that the number of credits in the register 560 is equal to zero, the predictive clock controller 530 sends a control signal to adjust the frequency of the clock signal to the new value for the third execution period. Following the update, the predictive clock controller 530 refreshes the register to set the number of credits equal to 32, which is the total number of barrier syncs of the predetermined type to take place during the third and fourth execution periods. Since the number of credits is zero until the credits are refreshed, no further barrier syncs of the predetermined type may take place until the frequency of the clock signal is updated. In other words, the application is not permitted to proceed to the third execution period until the clock signal is updated to the new frequency for the third execution period.

Although not illustrated in the table 710, for some execution periods, the predictive clock controller 530 may also determine to refresh the number of credits when the number of remaining credits is non-zero. In response to determining that the number of credits has reaches the predetermined number defined for the current execution period, the predictive clock controller 530 may send a signal to set the number of credits equal to the number of barrier syncs of the predetermined type for an upcoming one or more execution periods.

Therefore, according to the first embodiment, for at least some of the execution periods, the application may proceed to a next execution period before the clock frequency has been updated to the new value for the next execution period. This may be applied when the change in frequency between the two execution periods is small, or may be applied when the frequency for the next execution period represents an increase in the frequency as compared to the frequency for the previous execution period. Also according to the first embodiment, for others of the execution periods, the application may be prevented from proceeding to the next execution period until the clock frequency has been updated to the new value for the next execution period. This may be applied when the change in frequency between the two execution periods is large or may be applied when the frequency for the next execution period represents a decrease in the frequency as compared to the frequency for the previous execution period.

According to a second embodiment, the HSP 570 is configured to send an interrupt to the predictive clock controller 530 only when the number of credits in the register 560 reaches zero. In this case, the predetermined number of credits indicating that an execution period has ended is always zero. The predictive clock controller 530 will update the clock frequency to the new value for the next execution period in response to determining that the number of credits is zero.

Reference is made to FIG. 7C, which illustrates an example of the information that may be stored by the predictive clock controller 530 in the second embodiment. In this example, the predictive clock controller 530 stores an indication of the number of credits at the start of each execution period, which is the same as the number of barrier syncs of the predetermined type to take place during that execution period.

The table 720 shows the number of credits remaining at the end of each execution period. However, since this number is zero for each execution period, such a separate indication for each execution period may be omitted from the information stored by the predictive clock controller 530. Furthermore, although the table 720 shows the number of barrier syncs for each execution period, these numbers are the same as the number of credits at the start of each execution period, and so separate indications may be omitted from the information stored by the predictive clock controller 530. In the table 720, for simplicity the clock frequency values are not shown, but these may be the same as the values shown in the table 700 in FIG. 7A.

The predictive clock controller 530 adjusts the frequency of the clock source 540 once the number of credits in the register reaches zero. For instance, in the example of FIG. 7C, at the end of the first execution period, the number of credits in register 560 reaches zero. Once the predictive clock controller 530 determines that the number of credits in the register is equal to zero, the predictive clock controller 530 sends a control signal to adjust the frequency of the clock signal to the new value for the second execution period. Since the number of credits is zero until the credits are refreshed, no further barrier syncs of the predetermined type may take place until the frequency of the clock signal is updated. In other words, the application is not permitted to proceed to the second execution period until the clock signal is updated to the new frequency for the second execution period.

Therefore, whereas in the first embodiment, the application may be permitted to proceed from one execution period to another execution period without requiring the clock frequency to first be updated to the new value for the new execution period, in the second embodiment, the application is only permitted to proceed from one execution to the next once the clock frequency has been updated.

In both of the example credit control mechanisms described, when the number of credits reaches zero, the predictive clock controller 530 determines as such and sends a control signal to change the frequency of the clock signal provided to the processing unit 2. After sending the control signal, the predictive clock controller 530 receives an acknowledgment that the control signal has taken effect. In one example, the control signal may be a write to a register in the clock source 540 over a control bus, wherein the value in the register determines the frequency of the clock signal output by the clock source 540. The acknowledgment takes the form of a write completion, which is returned by the clock source 540 over the control bus to the predictive clock controller 530 in response to receipt of the write to the register of the clock source 540. The write completion indicates to the predictive clock controller 530 that the write has completed.

When it receives an acknowledgment that the control signal has taken effect, the predictive clock controller 530 refreshes the set of credits in register 560. The set of credits is set equal to the expected number of barrier syncs of the predetermined type for the next one or more execution periods. For example, in the example illustrated in table 720, if the second execution period has just finished, the predictive clock controller 530 sets the clock frequency to 400 MHz and sets the number of credits to be equal to 12, which is the expected number of barrier syncs of the predetermined type for the third execution period.

Therefore, the number of credits in the register 560 controls whether or not a barrier synchronisation is passed by the HSP 570. The predictive clock controller 530 will refresh the credits in register 560 once it has updated the clock frequency of the processing unit 2. The predictive clock control 530 may wait until it has received an acknowledgment from the clock source 540 that the frequency has been updated before refreshing the credits in register 560. Once the credits are refreshed, the HSP 570 decrements the credits and allows the barrier synchronisation to be passed by sending a sync acknowledgment to the GSP 550. Therefore, the credits can be used to prevent the processing unit 2 moving into the next execution period until the clock frequency has been updated by the predictive clock controller 530 to a value suitable for the next execution period.

Although it has been described that the chip 510*b* has two HSPs 570, 575, the HSP 575 is optional and may be excluded in some embodiments, with only the HSP 570 being used to control the passing of the barrier synchronisations of the predetermined type.

Embodiments have been described in which a set of credits in register 560 is used to determine when to modify the clock frequency. However, in other embodiments, the predictive clock controller 530 may determine the transition to the next execution period by other means. For example, the predictive clock controller 530 may receive the sync requests from the processing unit 2 and count the number of received sync requests for a barrier synchronisation of the predetermined type. In response to the received number of sync requests reaching the total amount for the execution period, the predictive clock controller may then issue the control signal to change the clock frequency.

Although it has been described that the barrier synchronisations of the predetermined type are synchronisations requiring host involvement or null synchronisations, in other embodiments different types of barrier synchronisations could be counted to determine when to change the frequency. In some embodiments, the barrier synchronisations of the predetermined type could be any type of external barrier synchronisation, including a synchronisation between processing units on different chips 510.

The power requirements information that is stored by the predictive clock controller 530 is determined from analysis of code for the application that executes on the processing unit 2. Such analysis may be carried out by the compiler of the application code.

Figure 8:
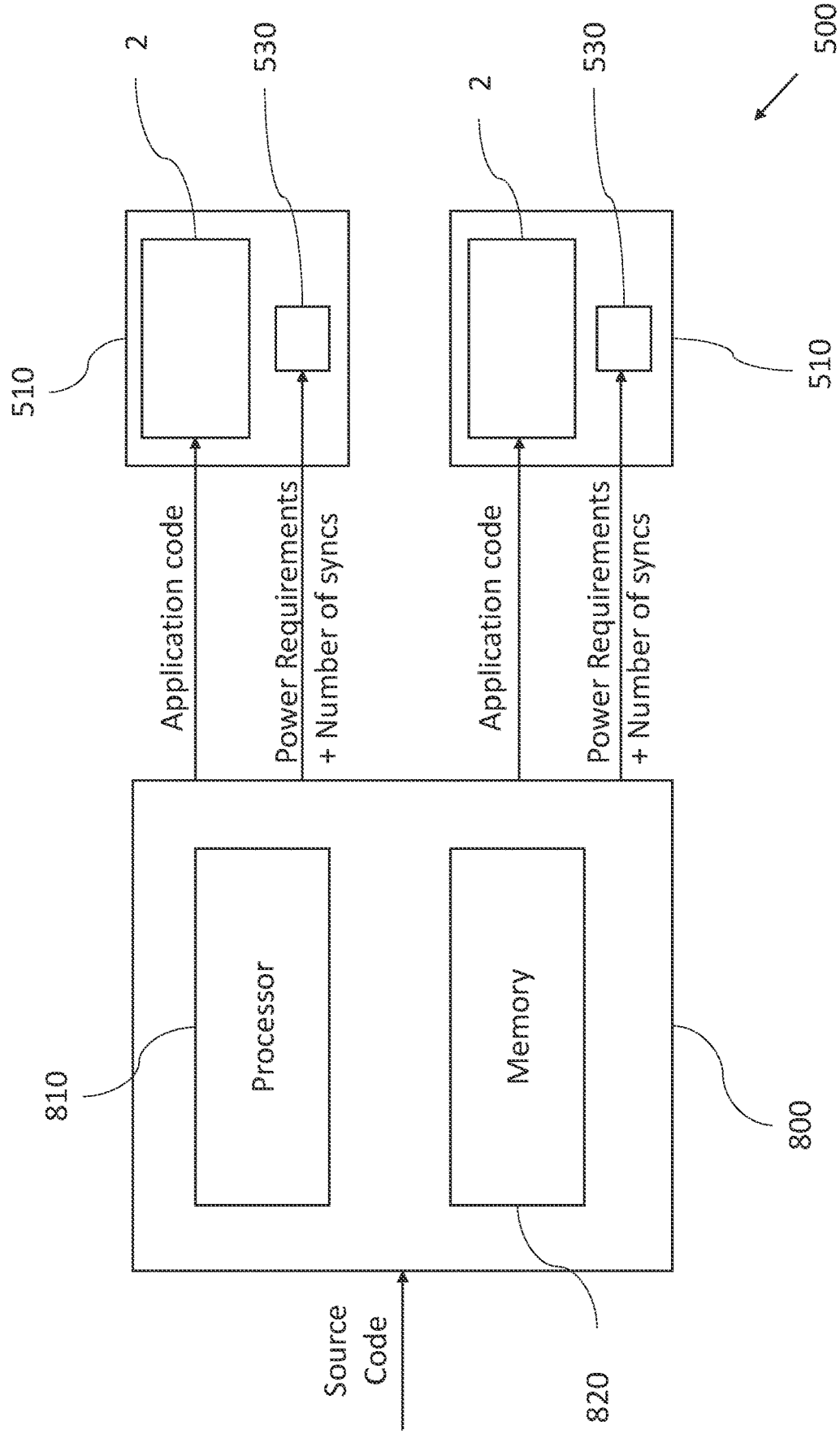
FIG. 8 is a schematic illustration of a system for compiling the applications to run on multiple chips.

Reference is made FIG. 8, which illustrates an example where the compiler generates the indication of the power requirements. The compiler is configured to execute on a data processing system 800 comprising at least one processor 810 and at least one memory 820. The compiler receives the source code for the applications that are to execute on the processing units 2 of the system 500. Only two processing units 2 are shown in FIG. 8, but it would be appreciated that there may be more than processing units 2. The source code is used to provide the application code for execution on each processing unit 2 of the system 500. The compiler derives different sets of application code for execution on different processing units 2 from the source code. This application code is written to the processing units 2 and stored in memory of the processing units 2 for execution by processing circuitry of the processing units 2.

The compiler is configured to derive from the source code, an indication of the power requirements for each execution period for the applications executing on the processing units 2. The compiler determines the power requirements in dependence upon the computational intensity for different parts of the application. The compiler divides the application into different execution periods having different power requirements. The compiler also determines the number of barrier syncs of the predetermined type for each application during each execution period. This information is written to each of the predictive clock controllers 530, which then uses this information to control the clock frequency during execution of the application running on its associated processing unit 2 as described. Examples of the information that may be written by the compiler to each chip 510 are shown in FIGS. 7A, 7B, and 7C.

Figure 9:
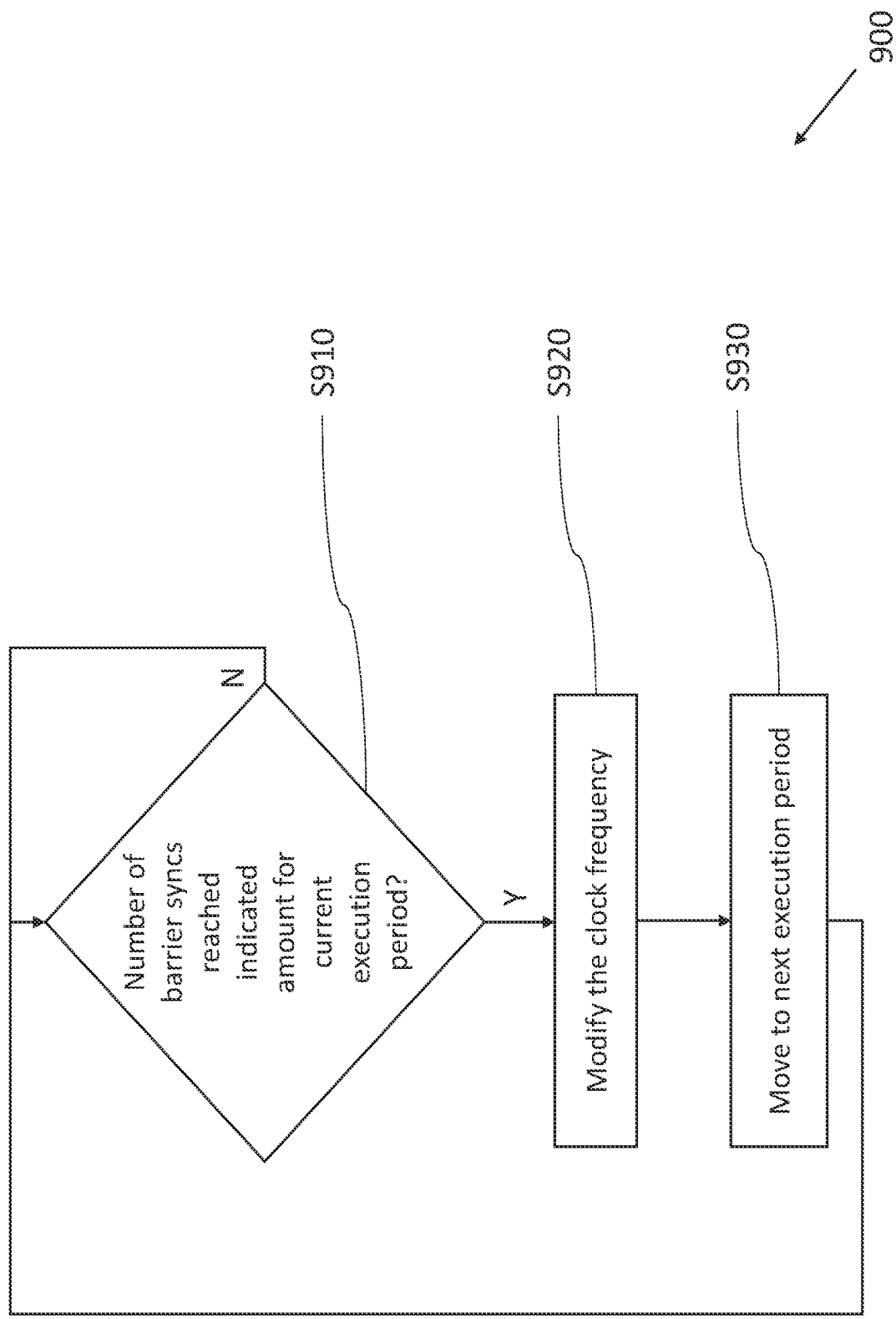
FIG. 9 illustrates a method according to embodiments of the application.

Reference is made to FIG. 9, which illustrates a method 900 according to embodiments of the application.

At S910, a check is made by the predictive clock controller 530 as to whether or not the number of barrier synchronisations of the predetermined type has reached the amount for the current execution period. The predictive clock controller 530 may determine this by checking whether or not the number of credits in register 560 has reached a predetermined number defined for the current execution period. If the number of credits has reached the predetermined number, the number of barrier synchronisations of the predetermined type is determined to have reached the amount for the current execution period. If the number of barrier synchronisation of the predetermined type is determined to have reached the amount for the current execution period, the method 900 proceeds to S920.

At S920, the predictive clock controller 530 issues control signals to modify the clock frequency.

At S930, the application moves to the next execution period. This may happen in response to the predictive clock controller 530 refreshing the credits in register 560.

The method 900 is repeated again for the next execution period.

It will be appreciated that the above embodiments have been described by way of example only.

The invention claimed is:

1. A device for use with a processing unit running an application, the device comprising processing circuitry and at least one memory, the at least one memory storing:
    indications of power usage requirements during different execution periods of the application; and
    an indication of a number of barrier synchronisations of a first type for each of the different execution periods of the application, wherein the processing circuitry is configured to for each of the different execution periods of the application:
  determine that a number of barrier synchronisations of the first type performed during a current one of the execution periods has reached the indicated number of barrier synchronisations for that execution period stored in the memory, wherein each of the barrier synchronisations of the first type is a barrier synchronisation following a compute phase of the processing unit; and
  in response to determining that the number of barrier synchronisations of the first type performed during the current execution period has reached the indicated number for that execution period, modifying a frequency of a clock signal supplied to the processing unit by an amount dependent upon the indication of the power usage requirements for a next one of the execution periods following the current one of the execution periods.

2. The device of claim 1, wherein at least one of the barrier synchronisations of the first type is a barrier synchronisation for which data exchange occurs between the host system and the processing unit during a following exchange phase.

3. The device of claim 1, wherein at least one of the barrier synchronisations of the first type is a null barrier synchronisation for which the processing unit does not exchange data in a following exchange phase.

4. The device of claim 1, wherein the barrier synchronisations of the first type comprise all external barrier synchronisations participated in by the processing unit.

5. The device of claim 1, wherein the device is associated with at least one storage configured to store a number of credits that are decremented upon each of the barrier synchronisation of the first type,
  wherein the step of determining that the number of barrier synchronisations of the first type has reached the indicated number comprises determining that the number of credits has reached a number.

6. The device of claim 5, wherein for each of at least one of the different execution periods, the processing circuitry is configured to:
  at an end of the respective one of the at least one of the different execution periods, refreshing the number of credits.

7. The device of claim 6, wherein for each of the at least one of the different execution periods, the number is zero.

8. The device of claim 6, wherein for each of the at least one of the different execution periods:
  the step of modifying the frequency of the clock signal comprises sending a control signal to modify the clock frequency; and
  the processing circuitry is configured to:
    following the sending of the control signal to modify the clock frequency, receive an acknowledgment of the modification of the clock frequency; and
    in response to the acknowledgment, perform the step of refreshing the number of credits.

9. The device of claim 1, wherein each of the indications of the power usage requirements comprises at least one of:
  an indication of the application computations during the respective execution period;
  an explicit indication of power usage by the application during the respective execution period; or
  an indication of clock frequency to be used for the processing unit during the respective execution period.

10. The device of claim 1, wherein the at least one memory is configured to receive the indications of the number of barrier synchronisations of the first type and the indications of power usage requirements during different execution periods of execution of the application from a compiler of the application.

11. The device of claim 1, wherein the processing unit comprises a plurality of processors.

12. The device of claim 1, wherein the device comprises the processing unit.

13. The device of claim 12, wherein the device comprises an integrated circuit.

14. The device of claim 1, wherein the device comprises the processing unit, and wherein the processing unit comprises a plurality of processors, and wherein the device comprises sync logic configured to, for each of the barrier synchronisations of the first type:
  receive a sync request from each of the processors of the processing unit.

15. The device of claim 14, wherein the sync logic is configured to acknowledge the sync requests in response to determining that a number of credits held in a credit register is non-zero.

16. The device of claim 1, wherein the device comprises the processing unit and sync logic associated with at least one storage, wherein the sync logic is configured to for each barrier synchronisation of the first type:
  receive a sync request; and
  in response to receipt of the sync request, acknowledge the sync request and decrement a number of credits held in the at least one storage.

17. A method for modifying a frequency of a clock signal supplied to a processing unit running an application, the method comprising for a first execution period of the application:
  determining that a memory-indicated number of barrier synchronisations of a first type have been performed during the first execution period, wherein each of the barrier synchronisations of the first type is a barrier synchronisation following a compute phase of the processing unit; and
  in response to determining that the memory-indicated number of barrier synchronisations of the first type has been reached, modifying the frequency of the clock signal by an amount dependent upon a stored indication of power usage requirements for a subsequent execution period.

18. The method of claim 17, wherein at least one of the barrier synchronisations of the first type is a barrier synchronisation for which data exchange occurs between a host system and the processing unit during a subsequent exchange phase.

19. The method of claim 17, wherein at least one of the barrier synchronisations of the first type is a null barrier synchronisation for which the processing unit does not exchange data in a following exchange phase.

20. The method of claim 17, wherein the barrier synchronisations of the first type comprise all external barrier synchronisations participated in by the processing unit.

21. A non-transitory computer readable medium storing a computer program, which when executed by a processor causes the processor to perform a method for modifying a frequency of a clock signal supplied to a processing unit running an application, the method comprising for a first execution period of the application:
  determining that a memory-indicated number of barrier synchronisations of a first type have been performed during the first execution period, wherein each of the barrier synchronisations of the first type is a barrier synchronisation following a compute phase of the processing unit; and in response to determining that the memory-indicated number of barrier synchronisations of the first type has been reached, modifying the frequency of the clock signal by an amount dependent upon a stored indication of power usage requirements for a subsequent execution period.

* * * * *